United States Patent
Skarp et al.

(10) Patent No.: US 6,884,465 B2
(45) Date of Patent: *Apr. 26, 2005

(54) PROCESS FOR PRODUCING ALUMINUM OXIDE FILMS AT LOW TEMPERATURES

(75) Inventors: Jarmo Skarp, Espoo (FI); Mervi Linnermo, Vantaa (FI); Timo Asikainen, Vantaa (FI)

(73) Assignee: ASM International NV, Bilthoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 10/829,894

(22) Filed: Apr. 21, 2004

(65) Prior Publication Data

US 2004/0197476 A1 Oct. 7, 2004

Related U.S. Application Data

(63) Continuation of application No. 10/003,749, filed on Oct. 23, 2001, now Pat. No. 6,743,475.

(30) Foreign Application Priority Data

Oct. 23, 2000 (FI) .............................................. 20002323

(51) Int. Cl.[7] .............................................. C23C 16/40
(52) U.S. Cl. ............................ 427/255.31; 204/192.22; 117/88
(58) Field of Search ....................... 427/255.31, 255.29; 204/192.1; 117/88

(56) References Cited

U.S. PATENT DOCUMENTS

| | | | |
|---|---|---|---|
| 6,015,590 A | 1/2000 | Suntola et al. | |
| 6,124,158 A | 9/2000 | Dautartas et al. | |
| 6,200,893 B1 * | 3/2001 | Sneh | .......................... 438/685 |
| 6,342,277 B1 | 1/2002 | Sherman | |
| 6,451,695 B2 | 9/2002 | Sneh | |
| 6,458,416 B1 | 10/2002 | Derderian et al. | |
| 6,743,475 B2 * | 6/2004 | Asikainen et al. | ..... 427/255.31 |
| 2001/0031379 A1 | 10/2001 | Tera et al. | |
| 2001/0052752 A1 | 12/2001 | Ghosh et al. | |
| 2002/0003403 A1 | 1/2002 | Ghosh et al. | |
| 2003/0129298 A1 | 7/2003 | Tera et al. | |

FOREIGN PATENT DOCUMENTS

| | | |
|---|---|---|
| JP | 58033841 | 2/1983 |
| WO | WO 00/55895 | 9/2000 |
| WO | WO 03/008110 A1 | 1/2003 |

OTHER PUBLICATIONS

Hiltunen et al. "Growth and Characterization of Aluminum Oxide Thin Films Deposited from Various Source Materials by Atomic Layer Epitaxy and Chemical Vapor Deposition Processes", Materials Chemistry and Physics, 28 (1991) pp. 379–388.

(Continued)

*Primary Examiner*—Bret Chen
(74) *Attorney, Agent, or Firm*—Knobbe, Martens Olson & Bear LLP

(57) ABSTRACT

A process for producing aluminum oxide thin films on a substrate by the ALD method comprises the steps of bonding a vaporizable aluminum compound to a growth substrate, and converting the bonded organoaluminum compound to aluminum oxide. The bonded aluminum compound is converted to aluminum oxide by contacting it with a reactive vapor source of oxygen other than water, and the substrate is kept at a temperature of less than 190° C. during the growth process. By means of the invention it is possible to produce films of good quality at low temperatures. The dielectric thin films having a dense structure can be used for passivating surfaces that do not endure high temperatures. Such surfaces include, for example, polymer films such as organic electroluminescent displays. Further, when a water-free oxygen source is used, surfaces that are sensitive to water can be passivated.

25 Claims, 4 Drawing Sheets

OTHER PUBLICATIONS

Kattelus, H. et al., "Electrical Properties of Tantalum Based Composite Oxide Films," *Mat. Res. Soc. Symp. Proc.*, vol. 284, pp. 511–516 (1993).

Kattelus, H. et al., "Layered tantalum–aluminum oxide films deposited by atomic layer epitaxy," *Thin Solid Films*, vol. 225, pp. 296–298 (1993).

Kim. Y. K. et al., "Novel capicitor technology for high density stand–alone and embedded DRAMs," *IEEE International Electron Devices Meeting*, IEDM (2000), no page numbers.

Kukli et al, "Atomic layer epitaxy growth of aluminum oxide thin films from a novel Al(CH3)2Cl precursor and H2O.", J. Vac. Sci. Technol. A 15(4), Jul./Aug. 1997, pp. 2214–2218.

Kukli, K. et al., "Properties of $Ta_2O_5$–Based Dielectric Nanolaminates Deposited by Atomic Layer Epitaxy," *J. Electrochem. Soc.*, vol. 144, No. 1, pp. 300–306 (1997).

Kukli, K. et al., Properties of $(Nb_{1-x}Ta_x)_2O_5$ Solid Solutions and $(Nb_{1-x}Ta_x)_2O_5$–$ZrO_2$ Nanolaminates Grown by Atomic Layer Epitaxy, *NanoStructured Materials*, vol. 8, No. 7, pp. 785–793 (1997).

Kukli, K., "Properties of atomic layer deposited $(Ta_{1-x}Nb_x)_2O_5$ solid solution films and $Ta_2O_5$–$Nb_2O_5$ nanolaminates," *Journal of Applied Physics*, vol. 86, No. 10 (1999), no page numbers.

Lakomaa, E–L. et al., "Surface reactions in $Al_2O_3$ growth from trimethylaluminum and water by atomic layer epitaxy," *Applied Surface Science*, vol. 107, pp. 107–115 (1996).

Ritala, M. et al., "Surface roughness reduction in atomic layer epitaxy growth of titanium dioxide thin films," *Thin Solid Films*, vol. 249, pp. 155–162 (1994).

Zhang, H. et al., "High permittivity thin film nanolaminates," *Journal of Applied Physics*, vol. 87, No. 4, pp. 1921–1924 (2000).

* cited by examiner

PROCESS FOR PRODUCING ALUMINUM OXIDE FILMS AT LOW TEMPERATURES

The present application claims priority under 35 U.S.C. §120 as a continuation of U.S. patent application Ser. No. 10/003,749, filed Oct. 23, 2001 now U.S. Pat. No. 6,743,475 and under and under §119(a) to Finnish Patent Application No. 20002323, filed Oct. 23, 2000.

BACKGROUND OF THE INVENTION

1. Field of the Invention

The present invention concerns a process for producing aluminum oxide films by an ALD type process. According to the preferred process the aluminum oxide films are produced at low temperatures by bonding a metal compound on a substrate and converting said metal compound into a metal oxide.

2. Description of Related Art

Dielectric thin films with a high dielectric constant (permittivity) have a number of applications in the field of microelectronics. For example, they may replace the $SiO_2$ and $Si_3N_4$ presently used in DRAM-memories in order to maintain the necessary capacitance as the size of capacitors is reduced.

$Al_2O_3$ films suitable for passivating surfaces have previously been prepared by physical processes, such as sputtering. The problem with the films produced by sputtering has been the unevenness of the resulting film, and the pinholes that are formed in the film. These pinholes may form a diffusion path for water through the film.

U.S. Pat. No. 6,124,158 discloses a method of reducing carbon contamination of $Al_2O_3$ thin films deposited by an ALD method. The ALD process uses organic aluminum precursors and water. In at least every third cycle, ozone is introduced into the reaction chamber to reduce carbon contaminants. The process has its limits since aluminum oxide films deposited below 190° C. were not dense or reproducible.

ALD methods have also been used for producing $Al_2O_3$ films by using aluminum alkoxides, trimethyl aluminum (TMA) or $AlCl_3$ as the aluminum source material and water, alcohols, $H_2O_2$ or $N_2O$ as the oxygen source material. $Al_2O_3$ films from TMA and water have been deposited at temperatures in the range of 150° C. to 400° C. Typically the temperature has been between 150° C. and 300° C. The resulting films had uniform thickness and did not contain any pinholes. However, the density of the film has been questionable at the lower end of the deposition temperature range.

In applications involving organic polymers or low molecular weight organic molecules, such as organic EL displays, the deposition temperature is preferably less than 150° C., while in applications where the substrate is sensitive to water it is not feasible to use water as the oxygen source material. Thus there is a need for a process of producing aluminum oxide films by ALD at low temperatures using an oxygen source other than water.

SUMMARY OF THE INVENTION

The present invention is based on the surprising finding that high-quality aluminum oxide thin film can be grown by an ALD type process at substrate temperatures down to 100° C. Another surprising finding is that ozone can be used in the deposition process without destroying the properties of substrates that contain an organic layer. A dense, pinhole-free thin film layer can be produced very quickly by ALD on the substrate surface, which protects the sensitive materials underneath the surface against the surrounding gas atmosphere.

In accordance with one aspect of the present invention a process is provided for depositing a thin film of aluminum oxide on a substrate by an atomic layer deposition process that comprises a plurality of cycles. Each cycle comprises supplying a first reactant that comprises a gaseous aluminum compound and supplying a gaseous second reactant that comprises a source of oxygen other than water. The second reactant converts the adsorbed portion of the first reactant on the substrate to aluminum oxide. Preferably the substrate is maintained at a temperature of less than 190° C. during the ALD process.

A number of considerable advantages are obtained by means of the preferred embodiments. For example, with the aid of the present invention, it is possible to produce $Al_2O_3$ films of good quality at low temperatures.

Dielectric thin films with a dense structure can be used for passivating surfaces that do not tolerate high temperatures. Such surfaces include, for example, polymer films. If a water-free oxygen source is used, surfaces that are sensitive to water can also be passivated.

In addition, dielectric films, including aluminum oxide thin films, with a dense structure can be used as buffer layers between functional films that include at least one organic film. The dielectric film then prevents either reaction or diffusion between the functional films.

DETAILED DESCRIPTION OF THE INVENTION

Definitions

For the purpose of the present invention, an "ALD type process" designates a process in which deposition of a thin film from gaseous source chemicals onto a substrate surface is based on sequential self-saturating surface reactions. The principles of the ALD process are disclosed, e.g., in U.S. Pat. No. 6,015,590.

"Reaction space" is used to designate a reactor or reaction chamber in which the conditions can be adjusted so that the deposition of a thin film on a substrate by ALD is possible.

"Thin film" is used to designate a film that is grown from elements or compounds that are transported as separate ions, atoms or molecules via vacuum, gaseous phase or liquid phase from the source to the substrate. The thickness of the film depends on the application and it varies in a wide range, e.g., from one molecular layer (about 5 nm) up to 1,000 nm, or even more.

By "dense" structure is meant a thin film which has a smaller leakage current through it, or which has a lower permeability to ions or gases when comparing two thin films consisting essentially of the same basic material, such as a thin film of $Al_2O_3$ deposited by the process of the present invention and a thin film of $Al_2O_3$ deposited using water.

The Deposition Process

An aluminum oxide thin film functioning as a dielectric or a passivating layer is grown on a desired substrate by ALD. The substrate is heated to the processing temperature, which is preferably selected from a range of about 100° C. to 190° C. More preferably the processing temperature is less than 150° C., even more preferably less than 140° C. and even more preferably less than 130° C.

In particular, the following organoaluminum compounds containing at least one alkyl group bound to aluminum may be used in the present invention:

Monoalkyl aluminum compounds $L^1AlX_2$ wherein X is selected from the group consisting of H, F, Cl Br, I, RCHO, wherein RCHO is an alkoxy group and $L^1$ is a linear or branched hydrocarbon that is saturated or unsaturated.

Dialkyl aluminum compounds $L^1L^2AlX$ wherein X is selected from the group consisting of H, F, Cl, Br, I, RCHO, wherein RCHO is an alkoxy ligand and $L^1$ and $L^2$ are linear or branched hydrocarbons with single, double and/or triple bonds.

Trialkyl aluminum compounds $L^1L^2L^3Al$ wherein $L^1$, $L^2$ and $L^3$ are linear or branched hydrocarbons with single, double and/or triple bonds.

The organoaluminum compound is preferably introduced into the reaction chamber in gaseous phase and contacted with the substrate surface.

Most preferably trimethyl aluminum $(CH_3)_3Al$, also known as TMA, is used as the aluminum source chemical.

Strongly oxidizing source chemicals containing oxygen are preferably used in the process. One or several chemicals selected from the following group are preferably used as an oxygen source: ozone, organic ozonides, oxygen atoms containing unpaired electrons, organic peroxides and organic peracids.

Figure 3:
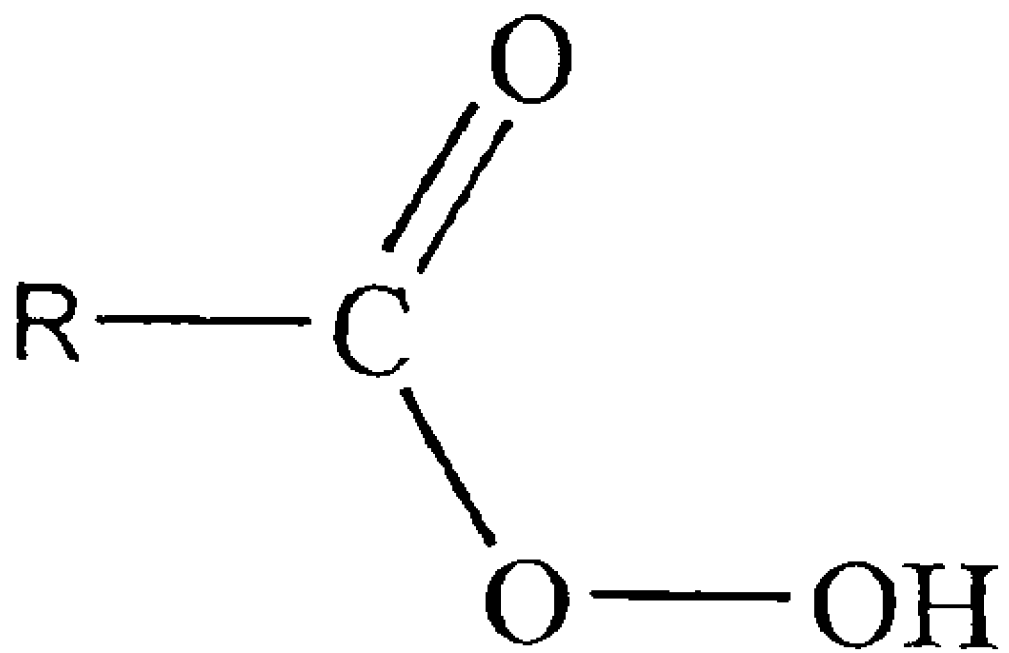
FIG. 3 depicts the structure of preferred peracids, such as peracetic acid $CH_3COOOH$, which contain OOH and O groups bound to the same carbon atom

Preferred peracids, such as peracetic acid $CH_3COOOH$, contain OOH and O groups bound to the same carbon atom as depicted in FIG. 3.

Figure 4:
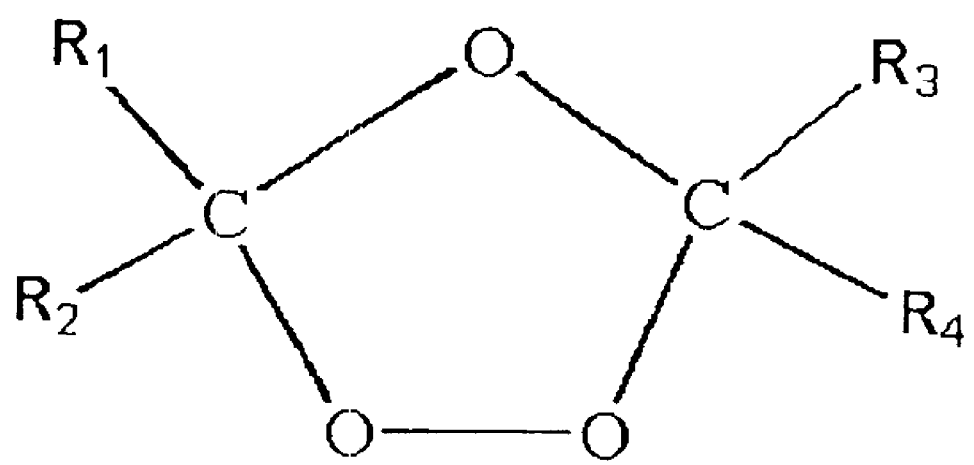
FIG. 4 depicts the structure of preferred organic ozonides, which contain both O and O—O groups between two carbon atoms.

Preferred organic ozonides contain both O and O—O groups between two carbon atoms, as depicted in FIG. 4.

Dimethyl peroxide and benzoyl peroxide are examples of suitable organic peroxides. In addition, other preferred peroxides include peroxides selected from the following group: $R^1$—O—O—$R^2$, wherein $R^1$ and $R^2$ are linear, branched or cyclic organic ligands such as $CH_3$, $(CH_3)_3C$, $C_6H_5$ or benzoyl; and $R^1$—O—O—H, wherein $R^1$ is a linear, branched or cyclic organic ligand such as $CH_3$, $(CH_3)_3C$ or $C_6H_5$.

Most preferably ozone is used as an oxygen source. Water is preferably not used as a source chemical in the deposition process. The resulting growth rate of aluminum oxide may be as good as around 0.8 Å/cycle. It is assumed that the surface reactions between ozone and trimethyl aluminum or fractions of trimethyl aluminum bound to surface, such as dimethyl aluminum and monomethyl aluminum, provide enough OH groups on the aluminum oxide surface for the self-saturating chemisorption reaction of the following trimethyl aluminum pulse with the substrate surface.

In addition to serving as an oxygen source for the process, ozone also contains a lot of chemical energy that is released when the molecule is broken.

$O_3(g) > ^3/_2 O_2(g) \Delta H_f^0 = -142.7$ kJ/mol and $\Delta G_f^0 = -163.2$ kJ/mol (N. N. Greenwood and A. Earnshaw, "Chemistry of the Elements", Pergamon Press Ltd., Oxford, England 1986.)

Figure 5:
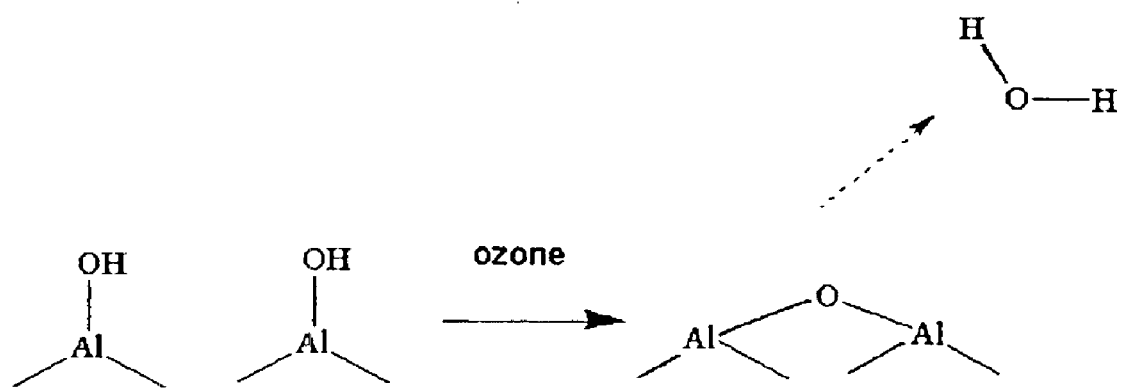
FIG. 5 depicts the elimination of surplus OH groups and formation of Al—O—Al bridges that may lead to the densification of $Al_2O_3$ surfaces.

Break up of ozone molecules can provide additional energy to the top molecular layers of surfaces and thus promote some surface reactions. The densification of $Al_2O_3$ surface may proceed via elimination of surplus OH groups and formation of Al—O—Al bridges as depicted in FIG. 5.

Also when the O—O bond of an organic peroxide breaks, the resulting RO fragments are highly reactive.

Before introducing ozone into the reaction chamber, the ozone is optionally diluted. Oxygen gas, inert gases such as nitrogen, or noble gases such as argon may be used for this purpose.

Examples of applications for which aluminum oxide films prepared according to the present process are particularly suitable are organic light-emitting diodes (OLED), organic electroluminescent displays (OEL), organic solar cells (OSC) and surface acoustic wave (SAW) filters. These applications generally require a low deposition temperature and/or are sensitive to moisture and/or oxygen.

Figure 1:
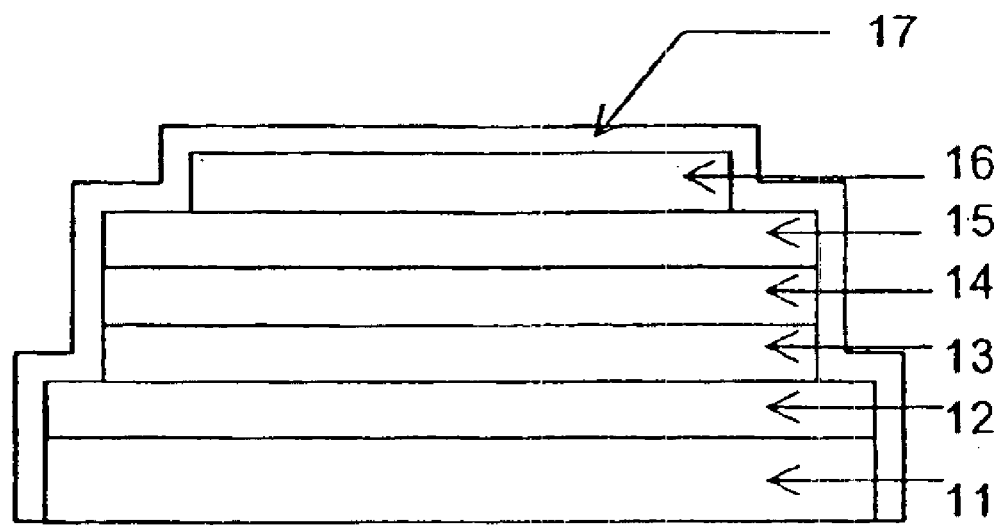
FIG. 1 is a schematic depiction of a cross-section of an organic EL display which is sealed against the surrounding gas atmosphere with a passivating layer.

According to a first preferred embodiment of the present invention, an organic EL display is provided with a passivating layer according to the preferred deposition process. A typical organic EL display is produced by arranging an anode 12 on a substrate 11 (cf. FIG. 1) that is typically made of glass or a similar material. A hole transport layer 13 is deposited on the anode 12 and an emission layer 14 is deposited on the hole transport layer 13. Further, a layer 15 capable of transporting electrons is deposited on the emission layer 14. All these layers 13–15 preferably comprise organic material. The organic material may be polymeric or low molecular weight molecules. A cathode 16 is then formed on the layer 15 capable of transporting electrons. The cathode 16 is preferably made of a metal such as aluminum, magnesium or calcium-coated aluminum. These metals easily acquire an oxide layer on the surface that may be detrimental to the interface between the metal and the organic layer. A passivating layer 17 is therefore deposited on the surfaces of the resulting structure by the present process. It is to be noted that "surfaces" means all the possible surfaces. Thus vertical surfaces are also preferably passivated.

Figure 2:
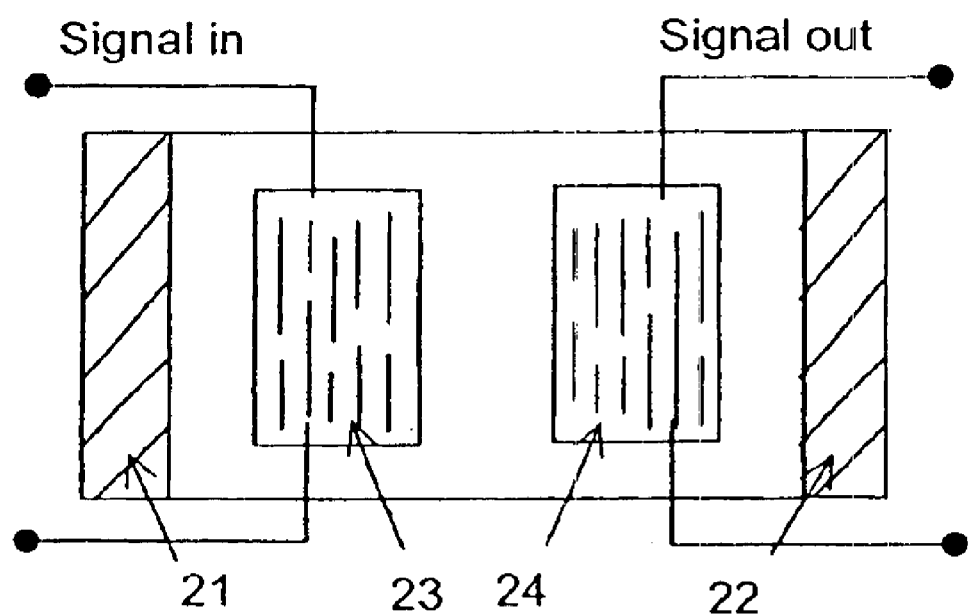
FIG. 2 depicts a structure of a SAW (Surface Acoustic Wave) filter.

According to a second preferred embodiment of the present invention, a SAW filter is provided with a protective layer according to the preferred deposition processes. A typical SAW filter is presented in FIG. 2. It comprises a first acoustic absorber 21 and a second acoustic absorber 22 placed on a piezoelectric substrate that is typically quartz, lithium niobate or lithium tantalate. The incoming signal is conducted to an input transducer 23 and the outgoing signal is collected from an output transducer 24. The input transducer 23 converts electrical signals to small acoustic waves that are reconverted to electrical signals by the output transducer 24. Usually the structure is hermetically encapsulated. The present invention replaces the hermetic encapsulation with a thin protective layer that is deposited on the surface of the SAW structure by the described process. Thus, a less expensive encapsulation process can be applied to the protected structure to obtain a finished SAW product.

In each of the above embodiments, the $Al_2O_3$ passivation layer is preferably between about 5 nm and 1,000 nm in thickness, more preferably between about 25 nm and 75 nm.

Examples of ALD reactors in which the low-temperature process can be performed include single wafer reactors, reactors with multiple wafers or other substrates in a planar or vertical substrate holder and batch process reactors. For example, organic solar cells are preferably coated with a protective layer by the process in a batch process reactor to keep the manufacturing costs per substrate low.

The invention is further illustrated with the aid of the following non-limiting working examples.

EXAMPLE 1

Depositing $Al_2O_3$ Thin Films Using Either Water or Ozone as an Oxygen Source

Case A: Deposition of $Al_2O_3$ Films with Water as an Oxygen Source $Al_2O_3$ thin films were deposited in a flow-type ALD reactor, model F-120, manufactured by ASM Microchemistry Oy, Finland. Trimethyl aluminum $(CH_3)_3Al$, also known as TMA, was used as an aluminum source chemical. Purified water was used as an oxygen source chemical. The source chemicals were introduced from external sources to the reactor.

A substrate was provided to the reaction space and the reactor was evacuated to vacuum with a mechanical vacuum pump. Next, the pressure of the reaction space was adjusted to a range of approximately 5–10 mbar with flowing nitrogen gas. Then the reaction space was heated to the deposition temperature.

Thin films were deposited at either 100° C. or 300° C. The source chemicals were pulsed into the reaction space according to the principles of ALD, e.g. the pulses were separated from each other with inert gas to prevent mixing of the source chemicals in the gas phase of the reaction space. Only surface reactions were allowed to occur.

The pulsing cycle was as follows:

| | |
|---|---|
| TMA pulse | 0.5 s |
| $N_2$ purge | 1.0 s |
| $H_2O$ pulse | 0.4 s |
| $N_2$ purge | 1.5 s |

The growth rate of $Al_2O_3$ from TMA and $H_2O$ was 0.8 Å/cycle at 300° C. and 0.5 Å/cycle at 100° C. The refractive index was 1.64 for the film grown at 300° C. and 1.59 for the film grown at 100° C. The films grown at 100° C. started to leak immediately in the electrical measurements and it was impossible to measure exact values for capacitance or breakdown voltage. It appeared that the films were not very dense. A summary of the properties is presented below in Table 1.

Case B: Deposition of $Al_2O_3$ Film with Ozone as an Oxygen Source.

$Al_2O_3$ thin films were deposited in a flow-type ALD reactor, model F-120, manufactured by ASM Microchemistry Oy, Finland. Trimethyl aluminum $(CH_3)_3Al$, also known as TMA, was used as an aluminum source chemical. Ozone prepared on the premises was used as an oxygen source chemical. The source chemicals were introduced from external sources to the reactor.

A substrate was provided to the reaction space and the reactor was evacuated to vacuum with a mechanical vacuum pump. Next, the pressure of the reaction space was adjusted to a range of approximately 5–10 mbar with flowing nitrogen gas. Then the reaction space was heated to the deposition temperature.

The thin films were deposited at either 100° C. or 300° C. The source chemicals were pulsed into the reaction space according to the principles of ALD as in case A.

The pulsing cycle was as follows:

| | |
|---|---|
| TMA pulse | 0.5 s |
| $N_2$ purge | 1.0 s |
| $O_3$ pulse | 4.0 s |
| $N_2$ purge | 1.5 s |

A summary of the properties of the resulting thin films is presented below in Table 1.

TABLE 1

| | Case B | Case B | Case A | Case A |
|---|---|---|---|---|
| Deposition temperature | 100° C. | 300° C. | 100° C. | 300° C. |
| Growth rate (Å/cycle) | 0.8 | 0.8 | 0.5 | 0.8 |
| Refractive index | 1.58 | 1.66 | 1.59 | 1.64 |
| Dielectric constant | 6.0 | 8.3 | * | |
| Breakdown voltage (MV/cm) | 4.5 | 6.0 | * | |

* The measurement could not be carried out due to electrically very leaky thin film.

A TOF-ERDA analysis of the film grown from TMA and ozone at 100° C. revealed that the film contained 6.0% carbon and 15.8% hydrogen.

A comparison between Case A and Case B shows that replacing water with ozone was beneficial for the deposition process at low temperature.

EXAMPLE 2

Depositing $Al_2O_3$ Thin Films on an Organic Layer Using Ozone as an Oxygen Source A substrate with an organic thin film was provided into the reaction space of an F-450 ALD reactor manufactured by ASM Microchemistry Oy, Finland. The pressure of the reaction space was adjusted to about 5–10 mbar with a mechanical vacuum pump and flowing nitrogen gas that had a claimed purity of 99.9999%. Then the temperature of the reaction space was adjusted to about 110° C. TMA evaporated from an external source and ozone prepared on the premises were alternately introduced into the reaction space and contacted with the surface. The pulsing times were 1 s for TMA and 4 s for $O_3$. The source chemical pulses were separated from each other with nitrogen gas. The purging time lasted for 1.0–1.5 s after each source chemical pulse. The pulsing cycle consisting of these two source chemical pulses and two purging periods was repeated until a 50 nm aluminum oxide thin film was produced on the substrate. Typically, around 600 pulsing cycles were needed for the deposition. As a result, the deposition process did not adversely affect the organic layer. Further, the passivated structure could be stored in ordinary room atmosphere without destroying the functionality of the organic layer.

Although the foregoing invention has been described in terms of certain preferred embodiments, other embodiments will become apparent to those of ordinary skill in the art in view of the disclosure herein. Additionally, while one embodiment is disclosed in the context of an EL display, and another embodiment is disclosed in the context of a SAW filter, the skilled artisan will readily find application for the principles disclosed herein in a number of different contexts.

Accordingly, the present invention is not intended to be limited by the recitation of preferred embodiments, but is intended to be defined solely by reference to the claims.

We claim:

1. A method for depositing a dielectric film on a substrate in a reaction chamber by an atomic layer deposition (ALD) process comprising alternately providing a gaseous metal compound and an oxygen source other than water to the reaction chamber, wherein the substrate is maintained at a temperature of less than 190° C. during the ALD process.

2. The method of claim 1, wherein the dielectric film comprises a metal oxide.

3. The method of claim 2, wherein the dielectric film comprises aluminum oxide.

4. The method of claim 1, wherein the oxygen source comprises one or more compounds selected from the group consisting of ozone, organic ozonides, oxygen atoms with unpaired electrons, organic peroxides and organic peracids.

5. The method of claim 1, wherein the oxygen source comprises one or more organic peroxides with the formula $R^1$—O—O—$R^2$ (IV), wherein $R^1$ is a linear, branched or cyclic organic ligand, and wherein $R^2$ is hydrogen or a linear, branched or cyclic organic ligand.

6. The method of claim 1, wherein the substrate is maintained at a temperature of less than 150° C. during the ALD process.

7. The method of claim 6, wherein the substrate is maintained at a temperature of less than 140° C. during the ALD process.

8. The method of claim 7, wherein the substrate is maintained at a temperature of less than 130° C. during the ALD process.

9. The method of claim 1, wherein the dielectric film is deposited to a thickness of between about 5 nm and about 1000 nm on the substrate.

10. The method of claim 9, wherein the dielectric film is deposited to a thickness of about 25 nm to about 75 nm.

11. The method of claim 1, wherein the substrate comprises an organic light emitting layer.

12. The method of claim 1, wherein the substrate comprises a surface acoustic wave filter.

13. The method of claim 1, wherein the substrate comprises an organic solar cell layer.

14. The method of claim 1, wherein the substrate is sensitive to moisture.

15. The method of claim 14, wherein the dielectric film protects the substrate from moisture.

16. The method of claim 1, wherein the dielectric film is deposited on an aluminum oxide layer that was previously deposited by chemical vapor deposition or physical vapor deposition.

17. The method of claim 1, wherein the substrate is sensitive to the atmosphere.

18. The method of claim 17, wherein the dielectric film protects the substrate from the atmosphere.

19. A method of passivating a substrate surface that is sensitive to high temperatures comprising depositing a metal oxide dielectric film on the surface by an atomic layer deposition (ALD) process comprising alternately contacting the substrate surface with a metal source and an oxygen source other than water, wherein the substrate is maintained at a temperature of less than 150° C. during the ALD process.

20. The method of claim 19, wherein the surface comprises a polymer film.

21. The method of claim 19, wherein the surface comprises an organic film.

22. The method of claim 19, wherein the oxygen source is ozone.

23. The method of claim 19, wherein the metal oxide comprises aluminum oxide.

24. The method of claim 19, wherein the substrate is maintained at a temperature of less than 130° C. during the ALD process.

25. A method of passivating a substrate surface that is sensitive to moisture comprising depositing a metal oxide dielectric film on the surface by an atomic layer deposition (ALD) process comprising alternately contacting the substrate surface with a metal source and an oxygen source other than water, wherein the substrate is maintained at a temperature of less than 190° C. during the ALD process.

\* \* \* \* \*

UNITED STATES PATENT AND TRADEMARK OFFICE
CERTIFICATE OF CORRECTION

PATENT NO. : 6,884,465 B2
DATED : April 26, 2005
INVENTOR(S) : Skarp et al.

It is certified that error appears in the above-identified patent and that said Letters Patent is hereby corrected as shown below:

<u>Title page,</u>
Item [75], Inventors, please delete "Asikainen" and insert -- Skarp --.
Item [56], References Cited, OTHER PUBLICATIONS,
"Kim. Y. K. et al.," reference, please delete "capicitor" and insert -- capacitor --.

<u>Column 1,</u>
Lines 6-7, after "6,743,475" please delete "and under.".

Signed and Sealed this

Eighth Day of November, 2005

JON W. DUDAS
*Director of the United States Patent and Trademark Office*